(12) United States Patent
Chen

(10) Patent No.: US 11,282,893 B2
(45) Date of Patent: Mar. 22, 2022

(54) DISPLAY PANEL, DISPLAY SCREEN, AND ELECTRONIC DEVICE

(71) Applicants: BEIJING XIAOMI MOBILE SOFTWARE CO., LTD. NANJING BRANCH, Nanjing (CN); BEIJING XIAOMI MOBILE SOFTWARE CO., LTD., Beijing (CN)

(72) Inventor: Yonghua Chen, Beijing (CN)

(73) Assignees: BEIJING XIAOMI MOBILE SOFTWARE CO., LTD. NANJING BRANCH, Nanjing (CN); BEIJING XIAOMI MOBILE SOFTWARE CO., LTD., Beijing (CN)

( * ) Notice: Subject to any disclaimer, the term of this patent is extended or adjusted under 35 U.S.C. 154(b) by 174 days.

(21) Appl. No.: 16/770,595

(22) PCT Filed: Jul. 29, 2019

(86) PCT No.: PCT/CN2019/098242
§ 371 (c)(1),
(2) Date: Jun. 6, 2020

(87) PCT Pub. No.: WO2021/016821
PCT Pub. Date: Feb. 4, 2021

(65) Prior Publication Data
US 2021/0408102 A1    Dec. 30, 2021

(51) Int. Cl.
*H01L 27/15*    (2006.01)
*H01L 33/62*    (2010.01)
*H01L 33/58*    (2010.01)

(52) U.S. Cl.
CPC ............ *H01L 27/156* (2013.01); *H01L 33/58* (2013.01); *H01L 33/62* (2013.01)

(58) Field of Classification Search
CPC ........ H01L 27/156; H01L 33/58; H01L 33/62
See application file for complete search history.

(56) References Cited

U.S. PATENT DOCUMENTS

| | | | |
|---|---|---|---|
| 10,840,307 B2* | 11/2020 | Gu | H01L 27/3276 |
| 2015/0042933 A1* | 2/2015 | Ueki | G02F 1/133514 |
| | | | 349/108 |
| 2018/0190672 A1* | 7/2018 | Lee | H01L 25/0753 |
| 2020/0144327 A1* | 5/2020 | Lee | H01L 33/60 |
| 2020/0318815 A1* | 10/2020 | Chen | H01L 33/44 |
| 2020/0357846 A1* | 11/2020 | Lee | H01L 25/0655 |
| 2021/0359231 A1* | 11/2021 | Zhaosong | H01L 51/0097 |

* cited by examiner

*Primary Examiner* — Victor A Mandala
(74) *Attorney, Agent, or Firm* — Syncoda LLC; Feng Ma

(57) ABSTRACT

A display panel includes a substrate and at least one pixel having a plurality of sub-pixels with a light transmission gap between two adjacent sub-pixels; the sub-pixel includes a metal circuit layer disposed on the substrate, a first electrode layer as a non-transparent anode disposed on the metal circuit layer, a light emission layer disposed on the first electrode layer, and a second electrode layer disposed on the light emission layer. Interference with effective imaging is reduced by adding the light shield layer in each display unit of the display panel to reduce stray light entering the imaging component, optimizing lossless rendering of the imaging quality of the under-screen imaging component, thereby balancing resolution and imaging quality.

20 Claims, 4 Drawing Sheets

DISPLAY PANEL, DISPLAY SCREEN, AND ELECTRONIC DEVICE

CROSS-REFERENCE TO RELATED APPLICATION

The present application is a national stage of International Application No. PCT/CN2019/098242 filed on Jul. 29, 2019, the disclosure of which is hereby incorporated by reference in its entirety.

TECHNICAL FIELD

The present disclosure relates to display technologies, and more specifically to a display panel, a display screen and an electronic device.

BACKGROUND

Under-screen imaging is the most promising direction and research hotspot in the display industry in recent years. However, at present, there is a problem that the overall image quality of the display screen is greatly affected, and the resolution and the contrast are greatly reduced. By analyzing the reason for decrease in image quality, it is found that the actual decrease of image quality is greater than the theoretical decrease of image quality caused by diffraction. The factors affecting decrease of the overall image quality are classified into three points: the transmittance decrease, the diffraction effect and the scattering effect. The current proposals focus on reducing diffraction effect. However, through theoretical analysis, simulation and experimental verification, it is found that the scattering effect on image quality is greater than the diffraction effect. When the display screen is in the range of effective imaging field of view, due to factors such as metal circuit stacking or other opaque materials, incident light may be reflected or scattered so that the angle of emitted light may be changed, and stray light is formed after entering an imaging assembly, causing interference to effective imaging and reducing the imaging quality.

SUMMARY

In view of this, an objective of the present disclosure is directed to provide a display panel, a display screen and an electronic device capable of simultaneously realizing good display and optical imaging function to solve part or all of the above technical problems.

In order to achieve the above objective, the technical proposals adopted by the present disclosure are as follows.

According to a first aspect of embodiments of the present disclosure, there is provided a display panel, comprising: display units and light transmission display units. The display unit includes: a substrate and at least one pixel disposed on the substrate. The pixel includes a plurality of sub-pixels with a light transmission gap between two adjacent sub-pixels; the sub-pixel includes a metal circuit layer disposed on the substrate, a first electrode layer disposed on the metal circuit layer, a light emission layer disposed on the first electrode layer, and a second electrode layer disposed on the light emission layer; wherein the first electrode layer is a non-transparent anode, and the display unit further includes a light shield layer which shields at least the light transmission gap.

According to a second aspect of embodiments of the present disclosure, there is provided a display screen, comprising: a primary display area and a secondary display area, wherein the secondary display area is made of any foregoing display panel.

According to a third aspect of embodiments of the present disclosure, there is provided an electronic device, comprising: a device body, an imaging component disposed on the device body, and the foregoing display screen, wherein the display screen is assembled on the device body, and the imaging component is correspondingly disposed at the secondary display area of the display screen.

The technical solutions provided by the embodiments of the present disclosure may have the following advantages: the interference with effective imaging is reduced by adding a light shield layer in the display unit of the display panel and thereby scattered light in the display unit entering the imaging component is reduced via complete light shielding, so as to achieve the most lossless rendering of the imaging quality of the under-screen imaging component, thereby providing an optimal balancing scheme for the display resolution of the display panel and the imaging quality of the display panel combined with the imaging component.

It should be understood that both the above general description and the following detailed description are exemplary and explanatory only and are not intended to limit the present disclosure.

BRIEF DESCRIPTION OF THE DRAWINGS

In order to more clearly illustrate the technical solutions in the embodiments of the present disclosure, the drawings used in the description of the embodiments will be briefly described below. It is apparent that the drawings in the following description illustrate only some embodiments of the present disclosure. Other drawings may also be obtained by those skilled in the art based on the drawings without creative efforts.

DETAILED DESCRIPTION

The technical solutions in the embodiments of the present disclosure will be described clearly and completely in conjunction with the drawings in the embodiments of the present disclosure. It is apparent that the described embodiments are only a part of the embodiments of the present disclosure, and not all of the embodiments. All other embodiments obtained by those skilled in the art based on the embodiments of the present disclosure without creative efforts would fall within the scope of protection of the present disclosure.

The terms used in the present disclosure are for the purpose of describing particular embodiments only, and are not intended to limit the present disclosure. The singular forms "a," "an" and "the" used in the present disclosure and the appended claims are also intended to include plural forms, unless other meanings thereof are clearly indicated by the context. It should also be understood that the term "and/or" as used herein refers to and includes any and all possible combinations of one or more associated listed items.

Some embodiments of the present disclosure will be described in detail below with reference to the accompanying drawings. In the case of no conflict, the following embodiments and the features in the embodiments may be combined with each other.

Figure 1:
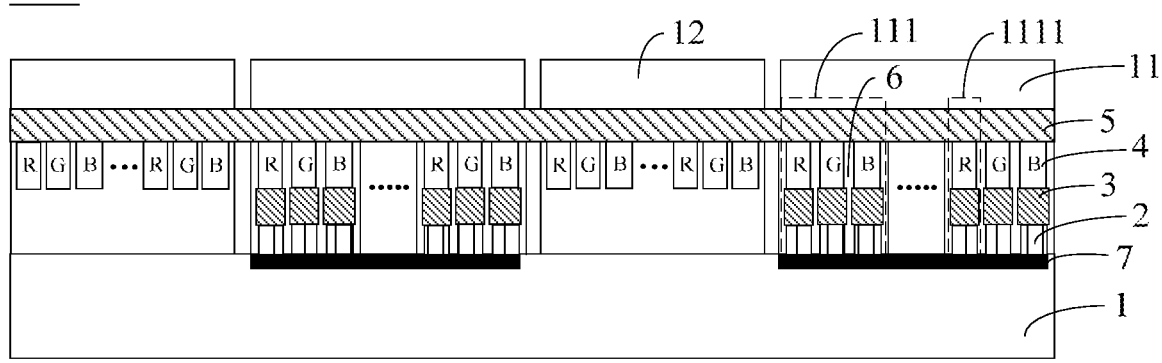
FIG. 1 is a sectional view illustrating a display panel according to an exemplary embodiment of the present disclosure.

Referring to FIG. 1, the display panel 10 according to the embodiment of the present disclosure includes display units 11 and light transmission display units 12. The display unit 11 includes a substrate 1 and at least one pixel 111 disposed on the substrate 1. In the case of including a plurality of pixels 111, the plurality of pixels 111 may be disposed on the substrate 1 in a matrix or any shape, and light transmission areas are formed between adjacent pixels 111. The pixel 111 includes a plurality of sub-pixels 1111; the sub-pixels 1111 may also be arranged in a matrix or any shape; light emitted by each sub-pixel 1111 is one of three primary colors of red (R), green (G) and blue (B), so the plurality of sub-pixels 1111 allow the pixel 111 to emit light of various colors via the cooperation of the three primary colors. Wherein, the sub-pixels 1111 emitting red (R), green (G) or blue (B) light may be arranged in any color matching form, and the arrangement of RGB in the drawings is only for illustration.

The sub-pixel 1111 includes a metal circuit layer 2 disposed on the substrate 1, a first electrode layer 3 disposed on the metal circuit layer 2, a light emission layer 4 disposed on the first electrode layer 3, and a second electrode layer 5 disposed on the light emission layer 4. Wherein, when power is supplied with appropriate voltage, the metal circuit layer 2 drives charges in the first electrode layer 3 and the second electrode layer 5 to be combined in the light emission layer 4, so that the light emission layer 4 could emit light.

In the embodiment of the present disclosure, the substrate 1 may be a rigid base, e.g., a transparent substrate such as a glass base, a quartz base or a plastic base. The substrate 1 may also be a flexible transparent base such as a polyimide (PI) film, so as to improve the transparency of components. The first electrode layer 3 is a non-transparent anode layer, and the second electrode layer 5 is a cathode layer.

A light transmission gap 6 is formed between two adjacent sub-pixels 1111. As the sub-pixels 1111 are arranged in a matrix or any shape, a plurality of light transmission gaps 6 are formed along the periphery of each sub-pixel 1111. In the prior art, incident light may be scattered or reflected with the stacking metal circuit layer 2 or other opaque materials in part of light transmission gaps 6, so emergent light may be deviated from the direction of the incident light, and stray light is formed when the emergent light converges in an imaging surface, causing decrease of the imaging quality of the display panel 10.

In order to solve the above technical problem, the display unit 11 in the present disclosure also includes a light shield layer 7 shielding at least the light transmission gaps 6 from which reflected light or scattered light is emitted. The present disclosure can effectively reduce scattering or the imaging quality loss caused by scattering via the arrangement of the light shield layer 7, improving the resolution of the display panel 10.

By the effect of the light shield layer 7 (namely the light shield layer 7 is adopted to eliminate reflected light and scattered light caused by the metal circuit layers 2 of the sub-pixels 1111), haze value of the display panel 10 is less than 20%. Optionally, by the effect of the light shield layer 7, the haze value of the display panel 10 is less than 15%. Wherein, it should be noted that the light shield layer 7 will reduce the overall transmittance of incident light through the display panel, but has less influence on the imaging quality.

The structure of the light transmission unit 12 in the present disclosure may be various. For example, the light transmission unit 12 may be not provided with light shield elements such as the metal circuit layer and the first electrode layer but only provided with transparent or semitransparent elements such as the light emission layer 4 and the second electrode layer 5. For another example, the metal circuit layer, the first electrode layer, the light emission layer and the second electrode layer may be removed in the case of allowable processes. Or moreover, the metal circuit layer may be made from transparent materials, with the same structure as that in the display unit 11, realizing both imaging and display function. Position and size of the light transmission units 12 are not specified in the present disclosure. Shape and arrangement mode of the light transmission units 12 are not limited herein. The light transmission unit 12 may be circular, square or in irregular shapes. The light transmission units 12 may be arranged in array or in a staggered or irregular distribution.

Position setting of the light shield layer 7 is not limited in the present disclosure. The objective of the light shield layer 7 is to reduce the influence of the scattered light or the reflected light on the imaging of the imaging components under the display panel 10. The specific setting position of the light shield layer 7 is defined in the following embodiments.

In the first embodiment, as shown in FIG. 1, each light shield layers 7 is disposed between the substrate 1 and the metal circuit layer 2 and overlaps the metal circuit layer 2 of each sub-pixel 1111 in the pixel 111. In the embodiment, the light shield layer 7 is attached to the entire display unit 11, more specifically, attached to the metal circuit layer 2 of each sub-pixel 1111, so as to eliminate reflected light or scattered light caused by the metal circuit layers 2 of the sub-pixels 1111 and thereby reduce the imaging quality loss of the under-screen imaging components due to the reflected light and the scattered light.

Figure 2:
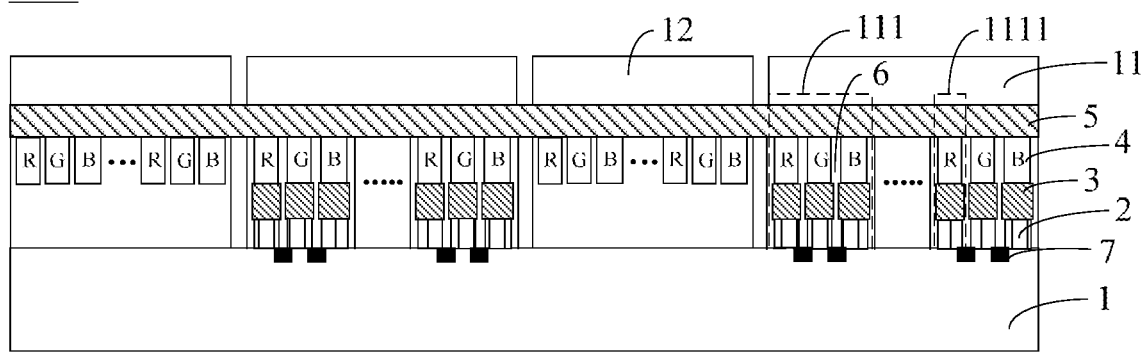
FIG. 2 is a sectional view illustrating a display panel according to another exemplary embodiment of the present disclosure.

In the second embodiment, as shown in FIG. 2, plurality of the light shield layers 7 are disposed between the substrate 1 and the metal circuit layer 2, and shield corresponding light transmission gaps 6 respectively in the display unit 11. As the first electrode layer 3 is a nontransparent anode, emitted light and scattered light of the metal circuit layer 2 are emitted from the light transmission gaps 6. In the embodiment, the light shield layer 7 is disposed between the substrate 1 and the metal circuit layer 2 to shield the light transmission gaps 6, namely disposed on a propagation path of reflected light and scattered light, so that the light shield layer 7 can eliminate the reflected light and the scattered light in the light transmission gaps 6 and reduce the imaging quality loss of the under-screen imaging components caused by the reflected light and the scattered light.

Figure 3:
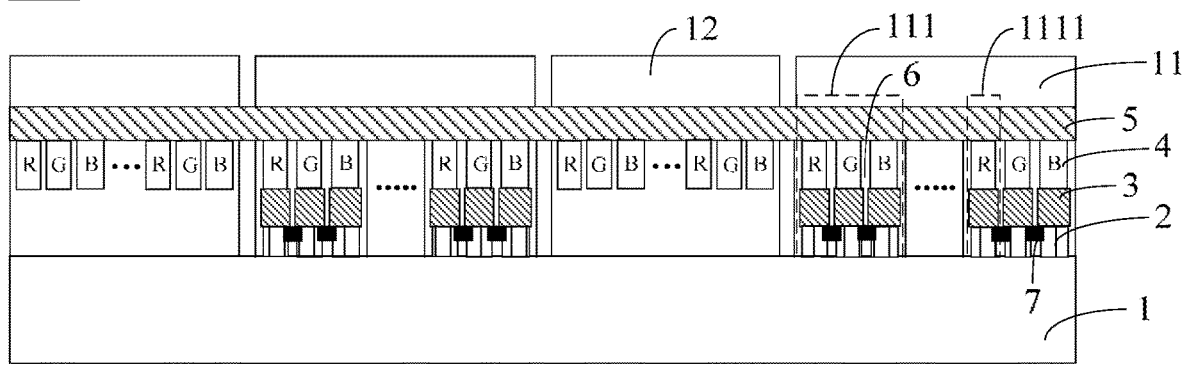
FIG. 3 is a sectional view illustrating a display panel according to still another exemplary embodiment of the present disclosure.

In the third embodiment, as shown in FIG. 3, plurality of the light shield layers 7 are disposed between the metal circuit layers 2 and the first electrode layers 3, and shield corresponding light transmission gaps 6 respectively in the display unit 11. As the first electrode layer 3 is a nontransparent anode, emitted light and scattered light of the metal circuit layer 2 are emitted from the light transmission gaps 6. In the embodiment, the light shield layer 7 is disposed between the metal circuit layer 2 and the first electrode layer 3 to shield the light transmission gaps 6, namely disposed on a propagation path of reflected light and scattered light, so that the light shield layer 7 can eliminate the reflected light and the scattered light in the light transmission gaps 6 and reduce the imaging quality loss of the under-screen imaging components caused by the reflected light and the scattered light. Wherein, the arrangement of the light shield layers 7 is required to ensure the electrical connection between the metal circuit layer 2 and the first electrode layer 3.

Figure 4:
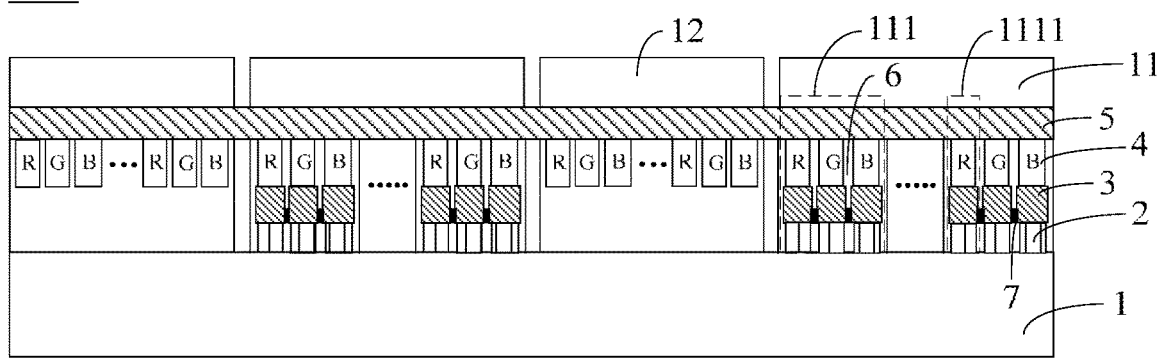
FIG. 4 is a sectional view illustrating a display panel according to still another exemplary embodiment of the present disclosure.

In the fourth embodiment, as shown in FIG. 4, each of plurality of the light shield layers 7 is connected to and interposed between the first electrode layers 3 in two adjacent sub-pixels 1111, and shields a corresponding light transmission gap 6 in the display unit 11. In the embodiment, the light shield layer 7 is connected to a side surface of the first electrode layer 3 to shield the light transmission gaps 6, and is cooperated with the nontransparent first electrode layer 3 to avoid incident light from being irradiated to the metal circuit layer 2 and forming reflected light and scattered light. The light shield layer 7 can eliminate the reflected light and the scattered light in the light transmission gaps 6 and reduce the imaging quality loss of the under-screen imaging components caused by the reflected light and the scattered light.

In the above embodiments, the material of the light shield layer 7 is not limited, as long as the effect of light shielding can be satisfied. More specifically, the light shield layer 7 may be a light shield metal layer or a black adhesive layer. When the light shield layer 7 is made from metal, metal such as Al, Ti or Cu may be adopted.

Figure 5:
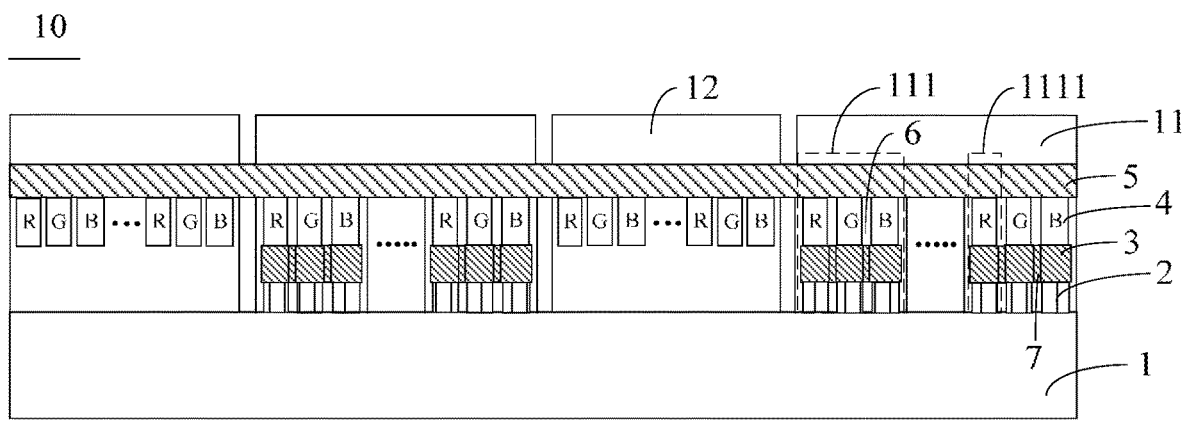
FIG. 5 is a sectional view illustrating a display panel according to still another exemplary embodiment of the present disclosure.

In another embodiment, as shown in FIG. 5, the light shield layer 7 may also be an extended electrode block disposed at the periphery of the first electrode layer 3 in the sub-pixel 1111, and the plurality of the extended electrode blocks shields the corresponding light transmission gaps 6 in the display unit 11 respectively. In the embodiment, the extended electrode blocks are adopted to shield the light transmission gaps 6 and integrally formed with the first electrode layers 3, and both the extended electrode blocks and the first electrode layers 3 are nontransparent anodes. In a few words, the light transmission gaps 6 are eliminated by increasing the size of the first electrode layer 3, so as to eliminate the reflected light and the scattered light in the light transmission gaps 6 and reduce the imaging quality loss of the under-screen imaging components caused by the reflected light and the scattered light.

In addition, in order to further improve the light transmission effect of the display panel 10, the light transmission display units 12 in the display panel 10 may employ transparent circuits, and the display panel 10 may be not provided with a polarization layer, so as to further improve the imaging quality of the imaging components.

In the present disclosure, the interference with effective imaging is reduced by adding the light shield layer in the display unit of the display panel and thereby stray light in the display unit entering the imaging component is reduced via complete light shielding, so as to achieve the most lossless rendering of the imaging quality of the under-screen imaging component, thereby providing an optimal balancing scheme for the display resolution of the display panel and the imaging quality of the display panel combined with the imaging component.

Figure 6:
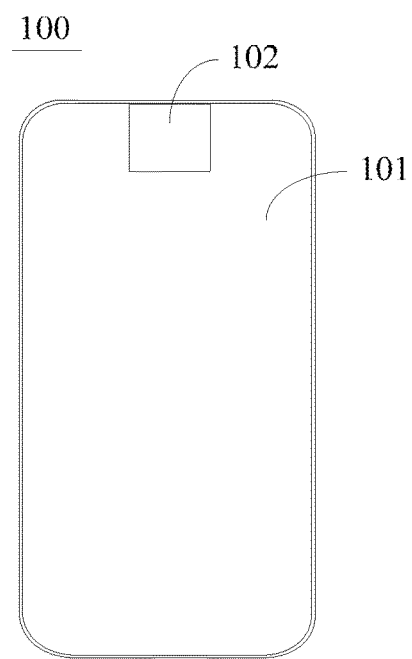
FIG. 6 is an internal schematic structural view illustrating a display screen according to an exemplary embodiment of the present disclosure.

Referring to FIGS. 6 and 1, according to another aspect of embodiments of the present disclosure, there is also provided a display screen 100. The display screen 100 is combined with an optical imaging system to simultaneously realize good display and imaging function. The display screen 100 includes a primary display area 101 and a secondary display area 102. Wherein, the secondary display area 102 is made of the display panel 10 according to the above embodiments. The secondary display area 102 may simultaneously realize display and imaging. The secondary display area 102 may be disposed at any position of the display screen 100 according to application demands.

The primary display area 101 in the present disclosure is mainly used for image display. The primary display area 101 is formed by the sequential stacking of the substrate 1, the metal circuit layer 2, the first electrode layer 3, the light emission layer 4 and the second electrode layer 5. The primary display area 101 and the secondary display area 102 have same structural layers, except for the difference: the secondary display area 102 adopts light transmission design. The display panel 10 in the secondary display area 102 in the present disclosure allows the display unit 11 to have light transmission effect by reducing the distribution density of pixels, adopting transparent materials for the first electrode layer 3 and the second electrode layer 5, changing the structural design of the metal circuit layer 2, and the like.

Moreover, the spacing between two adjacent pixels 111 in the secondary display area 102 is increased to increase the light transmission area of the secondary display area 102, so that the secondary display area 102 has light transmission effect.

In order to further improve the imaging quality of the imaging components corresponding to the display panel 10, the display panel 10 in the present disclosure further includes the light shield layer 7 that shields target light transmission gaps 6, and the target light transmission gaps 6 are light transmission gaps 6 from which reflected light or scattered light is emitted. In the present disclosure, the arrangement of the light shield layer 7 may effectively reduce scattering or the imaging quality loss caused by scattering and improve the resolution of the display panel 10. The specific setting position and material of the light shield layer 7 may refer to the above embodiments of the display panel 10, and no further description will be given here.

It should be noted that in an optical embodiment, the display screen 100 may also be only provided with the secondary display area 102 which is made of the display panel 10 according to the above embodiments.

Figure 7:
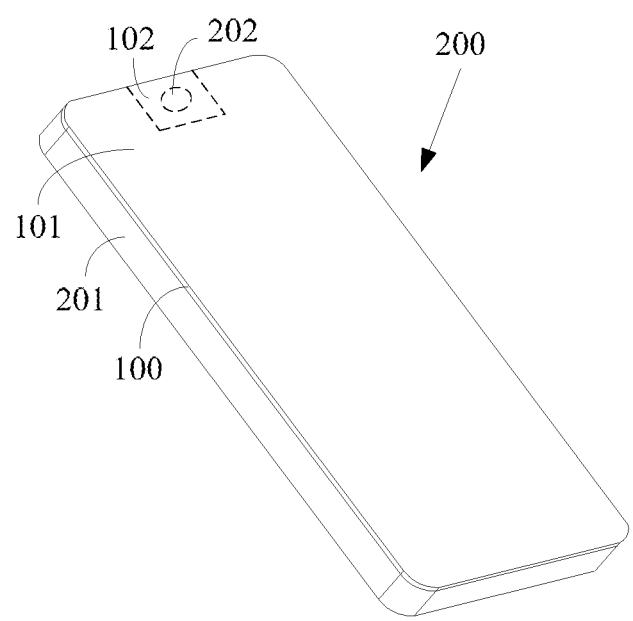
FIG. 7 is a schematic structural view illustrating an electronic device according to an exemplary embodiment of the present disclosure.

Referring to FIG. 7, according to another aspect of embodiments of the present disclosure, there is also provided an electronic device 200. The electronic device 200 includes a device body 201, an imaging component 202 disposed on the device body 201, and the display screen 100 according to the above embodiments. Wherein, the display screen 100 is assembled on the device body 201, and the imaging component 202 is correspondingly disposed at the secondary display area 102 of the display screen 100, so as to realize the arrangement of the under-screen imaging component 202, thereby satisfying the full screen display of the electronic device 200.

The electronic device in the present disclosure may be any device provided with the display screen, e.g., a mobile communication terminal (such as a mobile phone), a personal digital assistant (PDA), a mobile computer, a tablet, a wearable device, or the like.

The display screen 100 in the present disclosure includes a secondary display area 102. On the premise of ensuring normal display, the secondary display area 102 may also allow the imaging component 202 to shoot through the secondary display area 102 without affecting the shooting effect of the imaging component 202.

Optionally, the size of the secondary display area 102 is matched with that of the imaging component 202, so as to reduce the size of the secondary display area 102 as much as possible, thereby reducing the size of non-display areas of the display screen 100 in the case of shooting of the imaging component 202, and consequently improving the visual sense of users during use.

Other embodiments of the present disclosure will be apparent to those skilled in the art from consideration of the specification and practice of the present disclosure disclosed here. This application is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes can be made without departing from the scope thereof. It is intended that the scope of the present disclosure only be limited by the appended claims.

The invention claimed is:

1. A display panel, comprising a plurality of display units and a plurality of light transmission display units, wherein:
  each display unit includes a substrate, and at least one pixel disposed on the substrate;
  the pixel includes a plurality of sub-pixels with a light transmission gap between two adjacent sub-pixels;
  the sub-pixel includes a metal circuit layer disposed on the substrate, a first electrode layer disposed on the metal circuit layer, a light emission layer disposed on the first electrode layer, and a second electrode layer disposed on the light emission layer;
  the first electrode layer is a non-transparent anode, and the each display unit further includes a light shield layer configured to shield at least the light transmission gap.

2. The display panel of claim 1, in that wherein the light shield layer is disposed between the substrate and the metal circuit layer and overlaps the metal circuit layer of each sub-pixel in the display unit.

3. The display panel of claim 1, wherein a plurality of the light shield layers are disposed between the substrate and the metal circuit layers, and configured to respectively shield corresponding light transmission gaps in the display unit.

4. The display panel of claim 1, wherein a plurality of the light shield layers are disposed between the metal circuit layers and the first electrode layers, and configured to respectively shield corresponding light transmission gaps in the display unit.

5. The display panel of claim 1, wherein each of plurality of the light shield layer is connected to and interposed between the first electrode layers in two adjacent sub-pixels, and configured to shield corresponding light transmission gap in the display unit.

6. The display panel of claim 1, wherein the light shield layer is a light shield metal layer or a black adhesive layer.

7. The display panel of claim 1, wherein the light shield layer is an extended electrode block disposed at periphery of the first electrode layer in the sub-pixel; and plurality of the extended electrode blocks respectively shield corresponding light transmission gaps in the display unit.

8. The display panel of claim 1, wherein the light shield layer is configured to reduce a haze value of the display panel to be less than 20%.

9. A display screen, comprising a primary display area and a secondary display area, wherein:
  the secondary display area has a display panel including a plurality of display units and a plurality of light transmission display units;
  each display unit includes a substrate and at least one pixel disposed on the substrate;
  the pixel includes a plurality of sub-pixels with a light transmission gap between two adjacent sub-pixels;
  the sub-pixel includes a metal circuit layer disposed on the substrate, a first electrode layer disposed on the metal circuit layer, a light emission layer disposed on the first electrode layer, and a second electrode layer disposed on the light emission layer;
  the first electrode layer is a non-transparent anode, and the display unit further includes a light shield layer configured to shield at least the light transmission gap.

10. The display screen of claim 9, wherein the light shield layer is disposed between the substrate and the metal circuit layer and overlaps the metal circuit layer of each sub-pixel in the display unit.

11. The display screen of claim 9, wherein a plurality of the light shield layers are disposed between the substrate and the metal circuit layers, and configured to respectively shield corresponding light transmission gaps in the display unit.

12. The display screen of claim 9, wherein a plurality of the light shield layers are disposed between the metal circuit layers and the first electrode layers, and configured to respectively shield corresponding light transmission gaps in the display unit.

13. The display screen of claim 9, wherein each of plurality of the light shield layer is connected to and interposed between the first electrode layers in two adjacent sub-pixels, and shield corresponding light transmission gap in the display unit.

14. The display screen of claim 9, wherein the light shield layer is a light shield metal layer or a black adhesive layer.

15. The display screen of claim 9, wherein the light shield layer is an extended electrode block disposed at periphery of the first electrode layer in the sub-pixel; and plurality of the extended electrode blocks respectively shield corresponding light transmission gaps in the display unit.

16. The display screen of claim 9, wherein the light shield layer is configured to reduce a haze value of the display panel to be less than 20%.

17. An electronic device comprising the display screen of claim 9, a device body, and an imaging component disposed on the device body, wherein the display screen is assembled on the device body, and the imaging component is correspondingly disposed at the secondary display area of the display screen.

18. The electronic device of claim 17, wherein the imaging component is an under-screen imaging component.

19. The electronic device of claim 18, wherein the light shield layer in the each display unit of the display panel is configured to reduce stray light in the display unit entering the imaging component by complete light shielding, thereby optimizing lossless rendering of imaging quality of the under-screen imaging component, and balancing display resolution of the display panel and imaging quality of the under-screen imaging component.

20. The electronic device of claim 19, wherein the electronic device is a full-screen mobile phone, and the under-screen imaging component comprises an under-screen camera.

\* \* \* \* \*